US007773197B2

(12) United States Patent
Uemura

(10) Patent No.: US 7,773,197 B2
(45) Date of Patent: Aug. 10, 2010

(54) ILLUMINATION OPTICAL APPARATUS, EXPOSURE APPARATUS, AND DEVICE MANUFACTURING METHOD

(75) Inventor: Takanori Uemura, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/273,822

(22) Filed: Nov. 19, 2008

(65) Prior Publication Data

US 2009/0135393 A1    May 28, 2009

(30) Foreign Application Priority Data

Nov. 22, 2007  (JP)  ............... 2007-302789

(51) Int. Cl.
*G03B 27/54* (2006.01)
*G03B 27/42* (2006.01)
(52) U.S. Cl. .......................................... 355/67; 355/53
(58) Field of Classification Search ............... 355/52, 355/53, 55, 67–71; 250/548; 356/399–401
See application file for complete search history.

(56) References Cited

U.S. PATENT DOCUMENTS 6,236,449 B1 * 5/2001 Tanitsu ........................ 355/67
6,563,567 B1 * 5/2003 Komatsuda et al. ........... 355/71
7,423,731 B2 * 9/2008 Tanitsu et al. ................ 355/71
7,446,858 B2 * 11/2008 Kudo et al. .................. 355/71

FOREIGN PATENT DOCUMENTS

| JP | 05-021312 | A | | 1/1993 |
| JP | 05-251308 | A | | 9/1993 |
| JP | 2001-035777 | A | | 2/2001 |
| JP | 2001-035777 | | * | 9/2001 |

* cited by examiner

*Primary Examiner*—Hung Henry Nguyen
(74) *Attorney, Agent, or Firm*—Canon U.S.A., Inc., IP Division

(57) ABSTRACT

An illumination optical apparatus is configured to irradiate a light beam from a light source onto a surface to be irradiated. The illumination optical apparatus includes a first group of prisms which has a plurality of prisms, a second group of prisms which has a plurality of prisms, and a switch of a group of prisms which is capable of switching the first and the second groups of prisms so as to position one of the first and the second groups of prisms in an optical path. An annular ratio of the light beam emitted from one of the first and the second groups of prisms is changed by moving at least one of a plurality of prisms included in one of the first and the second groups of prisms positioned in the optical path in an optical axis direction, and an upper limit of the annular ratio of the light beam emitted from the first group of prisms is equal to or higher than a lower limit of the annular ratio of the light beam emitted from the second group of prisms and is lower than the upper limit of the annular ratio of the light beam emitted from the second group of prisms.

11 Claims, 10 Drawing Sheets

PATTERNS FORMED ON FOURIER
TRANSFORM SURFACE 304

ILLUMINATION OPTICAL APPARATUS, EXPOSURE APPARATUS, AND DEVICE MANUFACTURING METHOD

BACKGROUND OF THE INVENTION

1. Field of the Invention

The present invention relates to an illumination optical apparatus, an exposure apparatus, and a device manufacturing method.

2. Description of the Related Art

Recently, since a processing speed of a semiconductor is higher and electronic devices are scaled down, the requirement for miniaturizing semiconductor device patterns is higher and higher. In the process where fine circuit patterns are drawn on a substrate such as a silicon wafer or a glass plate, a photolithography technology is essential.

In the lithography process, a reticle (an original plate) on which a desired pattern is patterned in advance is illuminated and the image is transferred onto a photosensitive substrate via a projection optical system. Although the term of "a reticle" was used as an original plate in the above description, generally, "a reticle" is used when the projection optical system is a reduction optical system, and "a mask" is used when the projection optical system is a same magnification optical system. Although the present invention is not limited by a magnification ratio of the projection optical system, for easy understanding, hereinafter, the term of "a reticle" will be used.

The semiconductor exposure apparatus can be mainly categorized into two types of apparatuses that are a step-type exposure apparatus and a scan-type exposure apparatus. The step-type exposure apparatus has an advantage that the configuration is comparatively simple and the cost can be reduced compared to the scan-type exposure apparatus. However, a large exposure field of the projection optical system is needed for exposing a wider area. Therefore, it has a disadvantage in view of the aberration correction.

On the other hand, the scan-type exposure apparatus performs an exposure while synchronizing and scanning the reticle and the photosensitive substrate. It can expose an area lager than the exposure field of the projection optical system by scanning. Thus, it has an advantage that the size of the exposure field of the projection optical system can be reduced. Therefore, in view of the aberration correction of the projection optical system, the scan-type exposure apparatus is superior to the step-type exposure apparatus.

The resolution R of the exposure apparatus is generally represented by the following expression (1), which is called an expression of Rayleigh.

$$R = k1 \frac{\lambda}{NA} \quad (1)$$

In the expression (1), k1 is a process coefficient, $\lambda$ is a wavelength of a light source of an exposure apparatus, and NA is a numerical aperture of a projection optical system. In accordance with the expression of Rayleigh represented by the expression (1), the process coefficient k1 or the wavelength $\lambda$ needs to be smaller, or the numerical aperture NA of the projection optical system needs to be greater in order to draw fine circuit patterns with small resolution R.

Recently, as a means for making the numerical aperture NA of the projection optical system greater, an immersion exposure technology or the like has an attracted attention. However, generally, if the numerical aperture NA of the projection optical system is greater, the projection optical system gets bigger or more complex, and the cost of the exposure apparatus increases. The cost of the exposure light source with a small wavelength $\lambda$ is high. In using the exposure light source with a small wavelength $\lambda$, since the absorption rate and the birefringence of a glass material are large, there is a problem that the efficiency is decreased and a desired image quality can not be obtained.

As a means for making the resolution R small without changing the wavelength of the light source or the numerical aperture NA of the projection optical system, there is a method called RET (Resolution Enhancement Technology) which makes the process coefficient k1 small. For example, as one of the technologies, an auxiliary pattern or an offset of line width is provided on the reticle in accordance with the optical properties of the exposure optical system.

As a means for obtaining an effect which is equivalent to or more than such an optimization of the reticle, there is a means for optimizing, in accordance with the reticle pattern, the light intensity distribution on the pupil surface which has a relation of substantially a Fourier transform with the surface to be irradiated. This is generally called an off-axis illumination method. The light intensity distribution on the pupil surface which has a relation of substantially a Fourier transform with the surface to be irradiated and on the conjugate surface of the pupil surface is generally called an effective light source.

As an off-axis illumination, an annular illumination or a multipole illumination is the most common. The effective light source is often expressed by an illumination parameter of "outer σ", "inner σ", or "angular aperture" as shown in FIG. 8. The "outer σ" and the "inner σ" correspond to an outside diameter and an inside diameter of the effective light source, respectively. The "angular aperture" is an angle which is formed by an illumination part (an aperture part) when a point on the optical axis is an apex.

The parameter called an "annular ratio" is also often used. This is a ratio between the inner σ and the outer σ, and is defined as inner σ/outer σ. An optimal annular ratio is different in accordance with the reticle pattern. Therefore, it is preferable that an exposure apparatus is configured to be able to adjust the annular ratio.

As a method of adjusting the annular ratio, for example, Japanese Patent Laid-Open No. 5-21312 discloses a method of positioning a stop which has an annular shape adjacent to a pupil surface.

As another method of adjusting the annular ratio, Japanese Patent Laid-Open No. 5-251308 discloses a method of using a prism which has a refractive surface of a conical shape. It describes that it is preferable that the apparatus is configured to be able to set the annular ratio in a range of ⅓ to ⅔ by adjusting the space between a concave prism and a convex prism.

Furthermore, as another method of adjusting the annular ratio, Japanese Patent Laid-Open No. 2001-35777 discloses that a focal distance variable optical system, a conical prism, a space adjustable axicon, and a zoom lens are provided.

The method of positioning a stop which has an annular shape adjacent to a pupil surface as disclosed in Japanese Patent Laid-Open No. 5-21312 has a problem that the efficiency of the light which is used for exposure decreases in order to shield the light beam. Furthermore, there is another problem that a continuous adjustment of the annular ratio can not be performed.

According to the method of simply adjusting the space between the concave prism and the convex prism as disclosed in Japanese Patent Laid-Open No. 5-251308, for example, it was difficult to achieve the annular ratio variable in the range of ½ or lower to ¾ or higher. In this method, in order to widen the variable range of the annular ratio, it needs to make an inclined angle of the prism greater or to make a moving distance greater. However, when the inclined angle of the prism is large, the transmittance of the light gets small by the influence of reflecting or scattering of the light and enough efficient can not be obtained. Furthermore, when the moving distance of the prism is greater, the apparatus gets larger.

A method as disclosed in Japanese Patent Laid-Open No. 2001-35777 also needs a lot of optical elements to be positioned in an optical path. Therefore, the apparatus gets lager.

Thus, in the conventional technology, there was a problem that the decrease in efficiency was caused or the apparatus got larger if the annular ratio was continuously adjusted in a wide range.

BRIEF SUMMARY OF THE INVENTION

The present invention provides an illumination optical apparatus which is capable of continuously adjusting an annular ratio in a wide range. The present invention also provides an illumination optical apparatus which is capable of adjusting the annular ratio with suppressing the growth in size of the apparatus and the decrease in use efficiency of light from a light source.

An illumination optical apparatus as one aspect of the present invention is an illumination optical apparatus configured to irradiate a light beam from a light source onto a surface to be irradiated. The illumination optical apparatus includes a first group of prisms which has a plurality of prisms, a second group of prisms which has a plurality of prisms, and a switch of a group of prisms which is capable of switching the first and the second groups of prisms so as to position one of the first and the second groups of prisms in an optical path. An annular ratio of the light beam emitted from one of the first and the second groups of prisms is changed by moving at least one of a plurality of prisms included in one of the first and the second groups of prisms positioned in the optical path in an optical axis direction, and an upper limit of the annular ratio of the light beam emitted from the first group of prisms is equal to or higher than a lower limit of the annular ratio of the light beam emitted from the second group of prisms and is lower than the upper limit of the annular ratio of the light beam emitted from the second group of prisms.

An illumination optical apparatus as another aspect of the present invention is an illumination optical apparatus configured to irradiate a light beam from a light source onto a surface to be irradiated. The illumination optical apparatus includes a first group of prisms which has a plurality of prisms, and a second group of prisms which has a plurality of prisms. One of the first and the second groups of prisms includes a first concave prism and a first convex prism whose inclined surfaces are arranged so as to face each other, and has a shape of substantially a flat plate by combining the first concave prism with the first convex prism, and the other one of the first and the second groups of prisms is capable of being inserted into the optical path of the light beam. An annular ratio of the light beam emitted from one of the first and the second groups of prisms is changed by moving at least one of a plurality of prisms included in one of the first and the second groups of prisms positioned in the optical path in an optical axis direction, and an upper limit of the annular ratio of the light beam emitted from the first group of prisms is equal to or higher than a lower limit of the annular ratio of the light beam emitted from the second group of prisms and is lower than the upper limit of the annular ratio of the light beam emitted from the second group of prisms.

Further features and aspects of the present invention will become apparent from the following description of exemplary embodiments with reference to the attached drawings.

DETAILED DESCRIPTION OF THE PREFERRED EMBODIMENTS

Exemplary embodiments of the present invention will be described below with reference to the accompanied drawings.

Figure 2:
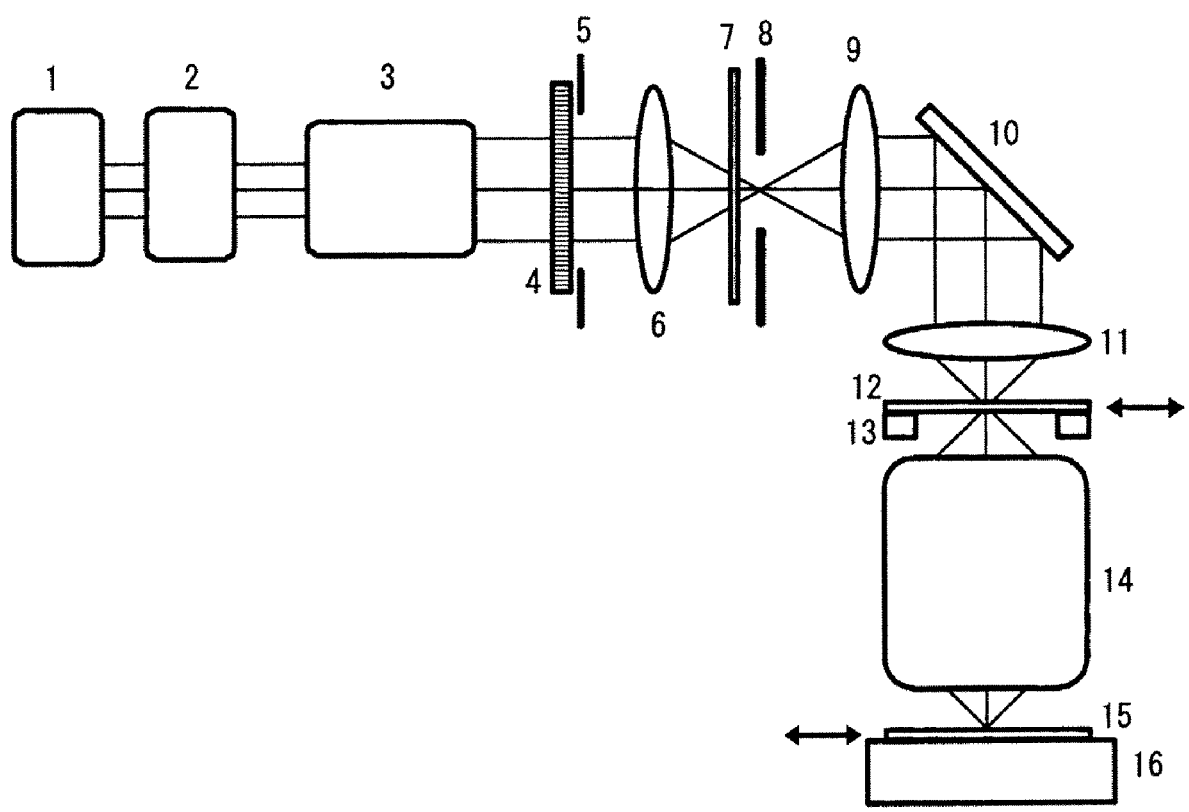
FIG. 2 is a schematic view of an exposure apparatus including an illumination optical apparatus in the embodiment of the present invention.

FIG. 2 schematically shows the configuration of an exposure apparatus including an illumination optical apparatus in an embodiment of the present invention. The illumination optical apparatus includes optical members of a relay optical system 2 through a condenser optical system 11 as described later. However, the illumination optical apparatus is not limited to this configuration.

A light source 1 is, for example, an ArF laser whose wavelength is about 193 nm or a KrF laser whose wavelength is about 248 nm. However, the present invention is not limited to the type, the wavelength, or the number of the light source. The light source is not limited to the laser. Non-laser light source such as a mercury lamp can also be adopted.

A relay optical system 2 magnifies or reduces a light beam from the light source 1 and introduces the light beam to a beam shaping optical system 3 in a state of substantially parallel light.

The beam shaping optical system 3 includes a plurality of optical elements, a zoom optical system, and the like. The beam shaping optical system 3 controls so that the intensity distribution and the angle distribution of the light beam entering an optical integrator 4 at a subsequent stage are desired distributions. The detailed function of the beam shaping optical system 3 will be described later.

The optical integrator 4 is, for example, a micro lens array in which a plurality of refractive optical elements, reflective optical elements, or diffractive optical elements such as a Fresnel lens are two-dimensionally arranged. The optical integrator 4 can be a computer-generated hologram (CGH) which is designed to obtain a desired pattern. The light beam emitted from the optical integrator 4 is condensed by a condenser optical system 6 and illuminates the surface where a scanning field stop 8 is positioned in a superimposed manner.

A light shielding member 5 is positioned adjacent to the emitted surface of the optical integrator 4. The surface where the light shielding member 5 is positioned has a conjugate relation with a pupil surface of a projection optical system 14 and can form a variety of off-axis illuminations in accordance with the shape of the light shielding member 5.

Figure 3:
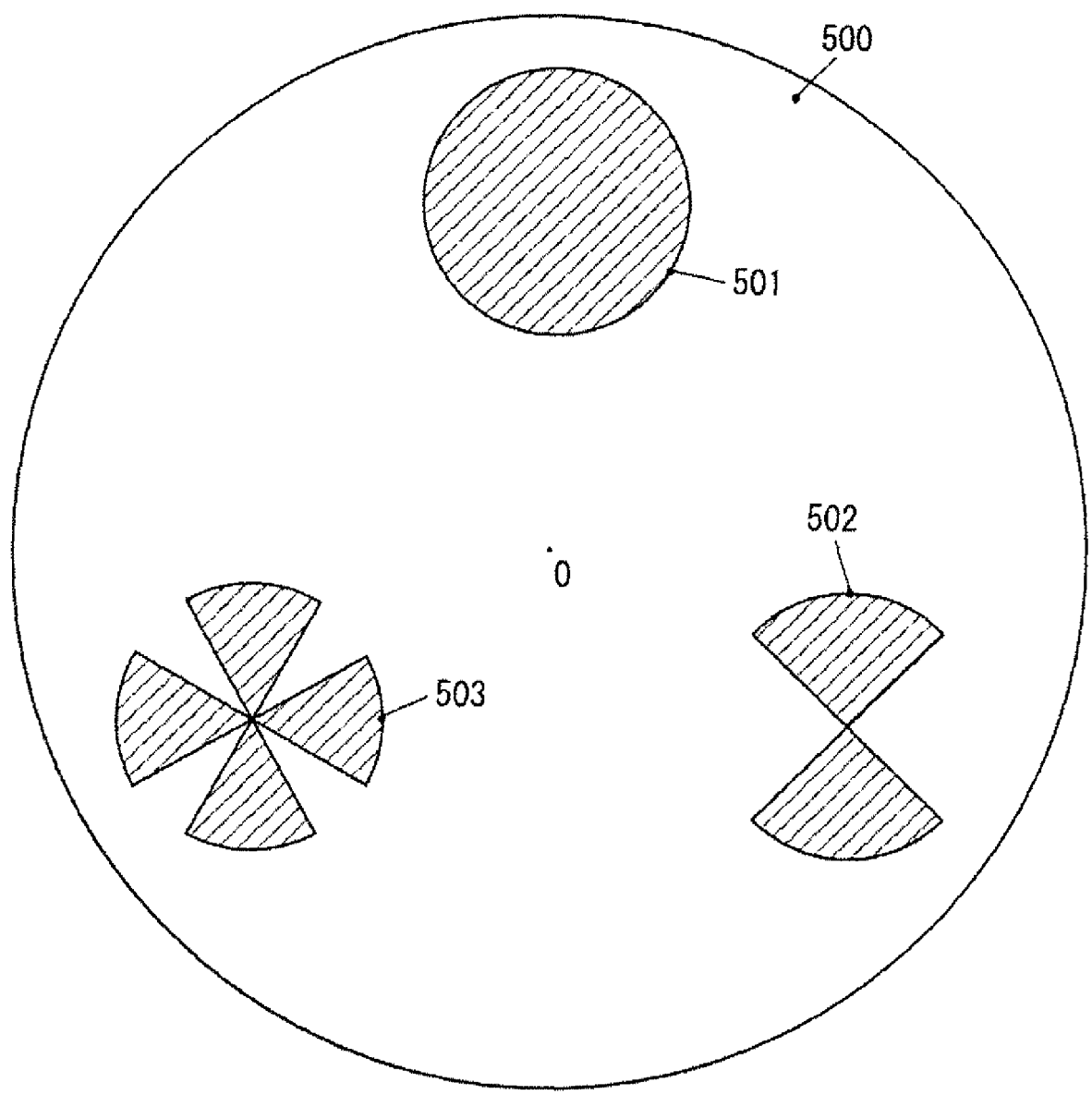
FIG. 3 is a schematic view of a light shielding member in the embodiment of the present invention.

Referring to FIG. 3, one example of a specific switching mechanism of the light shielding member 5 is described. The light shielding member 5 is formed by a plurality of stops, each of which has a different shape, positioned on a circular board 500. The board 500 is configured to be rotatable based on the point O as a center of the rotation so that one of stops 501, 502, and 503 is positioned in the optical path.

The stop 501 is a common aperture stop. The stop 502 is a stop for a dipole illumination, and it can form the dipole illumination by cutting the light beam from a conventional illumination, an annular illumination, or the like. The stop 503 is a stop for a quadrupole illumination, and it can form the quadrupole illumination by cutting the light beam from the conventional illumination, the annular illumination, or the like.

A light-attenuating member 7 is, for example, a density filter or a metal blade. The intensity distribution of the light reaching the surface to be irradiated can be adjusted by controlling the movement or the rotation of the light-attenuating member 7.

A scanning field stop 8 is positioned at a conjugate position with respect to the surface to be irradiated where a reticle 12 (an original plate) is positioned. The scanning field stop 8 includes a plurality of movable light shielding plate, and limits the illumination area of the surface to be irradiated by arbitrarily controlling the aperture shape.

The light beam passing through the scanning field stop 8 is introduced to the surface to be irradiated by a condenser optical system 9, a mirror 10, and a condenser optical system 11.

The retile 12 is held by a reticle stage 13. The pattern drawn on the reticle 12 which is positioned at the surface to be irradiated is transferred onto a wafer 15 which is positioned at an exposure surface by a projection optical system 14.

A wafer stage 16 holds the wafer 15 and is controlled so as to move in an optical axis direction and to two-dimensionally move along the plane surface orthogonal to the optical axis.

In a scan-type exposure method, a scanning exposure is performed while the reticle 12 and the waver 15 are synchronized to move in a direction of arrow (in a horizontal direction) in FIG. 2. In the case where the reduced magnification of the projection optical system 14 is $1/\beta$, when the scanning velocity of the wafer stage 16 is V, the scanning velocity of the reticle stage 13 is $\beta V$.

Embodiment 1

Figure 1:
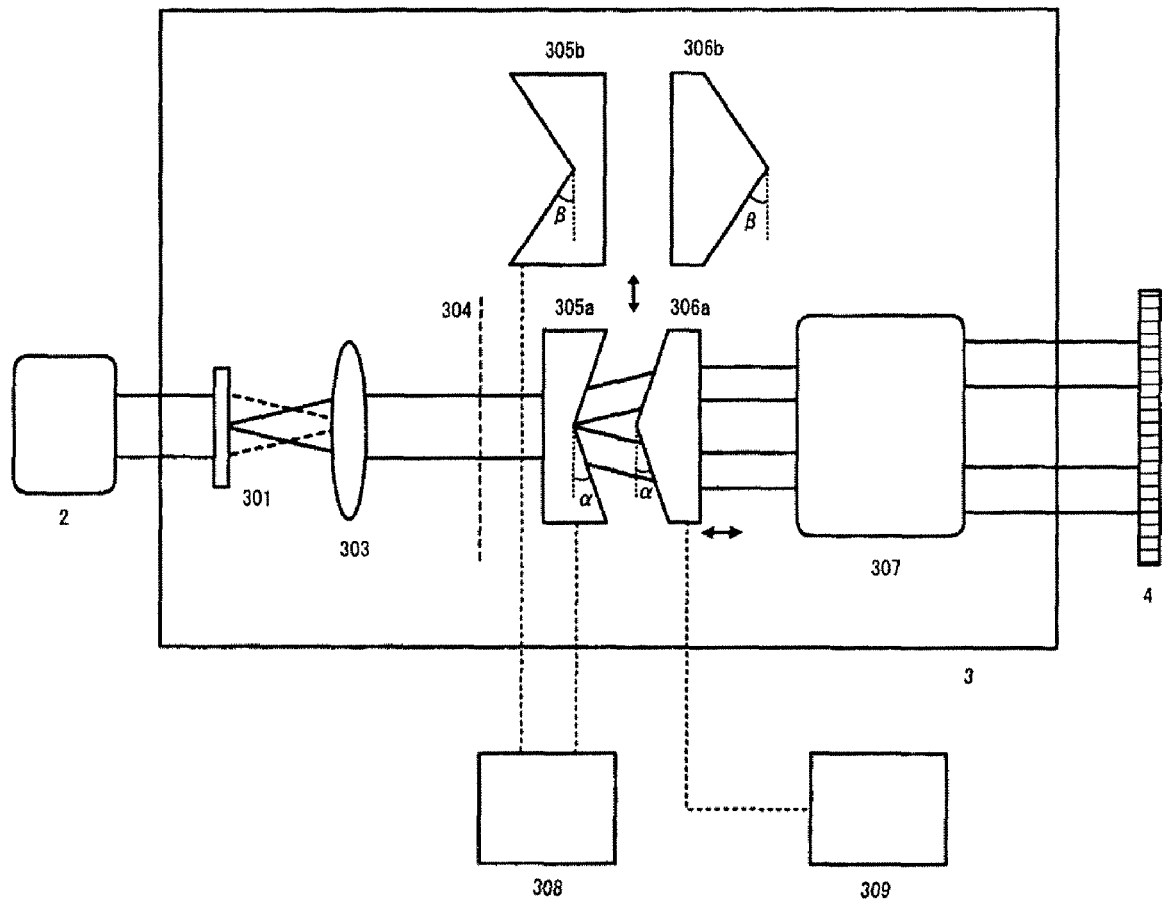
FIG. 1 is a schematic view of a beam shaping optical system in Embodiment 1 of the present invention.

Next, referring to FIG. 1, the configuration of the beam shaping optical system 3 in Embodiment 1 will be described in detail.

A light beam introduced from a relay optical system 2 to a beam shaping optical system 3 enters a diffractive optical element 301. The diffractive optical element 301 is a computer-generated hologram which is designed to be able to obtain a desired pattern, for example.

The light beam emitted from the diffractive optical element 301 is condensed by a condenser optical system 303 and forms a circular pattern on a Fourier transform surface 304.

The light beam passing through the Fourier transform surface 304 enters a conical concave prism 305a (a first concave prism) and a conical convex prism 306a (a first convex prism) in sequence.

A first group of prisms including the conical concave prism 305a and the conical convex prism 306a is configured so as to be switched to a second group of prisms including a conical concave prism 305b (a second concave prism) and a conical convex prism 306b (a second convex prism) Switching the group of prisms is performed by a switch of a group of prisms 308. Thus, the switch of a group of prisms 308 switches the first group of prisms and the second group of prisms to position one of the groups of prisms in an optical path.

The conical concave prisms 305a and 305b and the conical convex prism 306a and 306b have a complementary refractive action each other. Therefore, when the light beam which is parallel to an optical axis enters the conical concave prisms 305a and 305b, the light beam is emitted from the conical convex prisms 306a and 306b in parallel to the optical axis after the light beam is refracted by the conical concave prisms 305a and 305b and the conical convex prisms 306a and 306b.

A prism moving means 309 moves at least one of a concave prism and a convex prism constituting any one of groups of prisms selected from the first group of prisms and the second group of prisms which is introduced in the optical path by the switch of a group of prisms 308. Therefore, at least one of the conical concave prisms 305a and 305b and the conical convex prisms 306a and 306b is configured to be movable in the optical axis direction. Thus, the annular ratio of the light beam emitted from the group of prisms can be adjusted by changing the relative position of the conical concave prisms 305a and 305b and the conical convex prisms 306a and 306b using the prism moving means 309.

The light beam emitted from the group of prisms is magnified or reduced with substantially the similarity shape held by a zoom optical system 307, and is introduced from the beam shaping optical system 3 to an optical integrator 4. Therefore, the annular ratio of the light beam emitted from the zoom optical system 307 is substantially the same as that of the light beam entering the zoom optical system 307.

The conical concave prisms 305a and 305b and the conical convex prisms 306a and 306b have an inclined surface which is inclined at a predetermined angle. The inclined angles of the conical concave prism 305a and the conical convex prism 306a are substantially the same each other, and each of these prisms has an inclined angle $\alpha$. Similarly, the inclined angles of the conical concave prism 305b and the conical convex prism 306b also have substantially the same each other, and each of the prisms has an inclined angle $\beta$.

It is preferable that the inclined angle $\alpha$ of the conical concave prism 305a and the conical convex prism 306a is smaller than the inclined angle $\beta$ of the conical concave prism 305b and the conical convex prism 306b. In this case, the refractive action of the conical concave prism 305a and the conical convex prism 306a is smaller than that of the conical concave prism 305b and the conical convex prism 306b.

The conical concave prism 305a and the conical convex prism 306a are arranged so that the inclined surfaces having the refractive action face each other. On the other hand, the conical concave prism 305b and the conical convex prism 306b are arranged so that the inclined surfaces having the refractive action face each other in opposite directions.

Next, referring to FIGS. 5 and 6, the difference between the range of the annular ratio which is adjustable by the conical concave prism 305a and the conical convex prism 306a and the range of the annular ratio which is adjustable by the conical concave prism 305b and the conical convex prism 306b will be described.

Figure 5A:
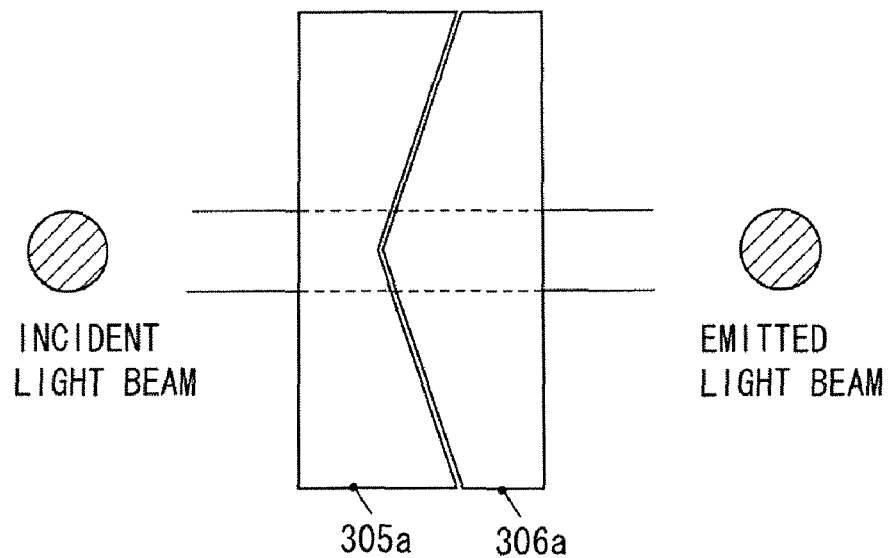
FIGS. 5A and 5B are illustrations of a first group of prisms in Embodiment 1 of the present invention.
Figure 5B:
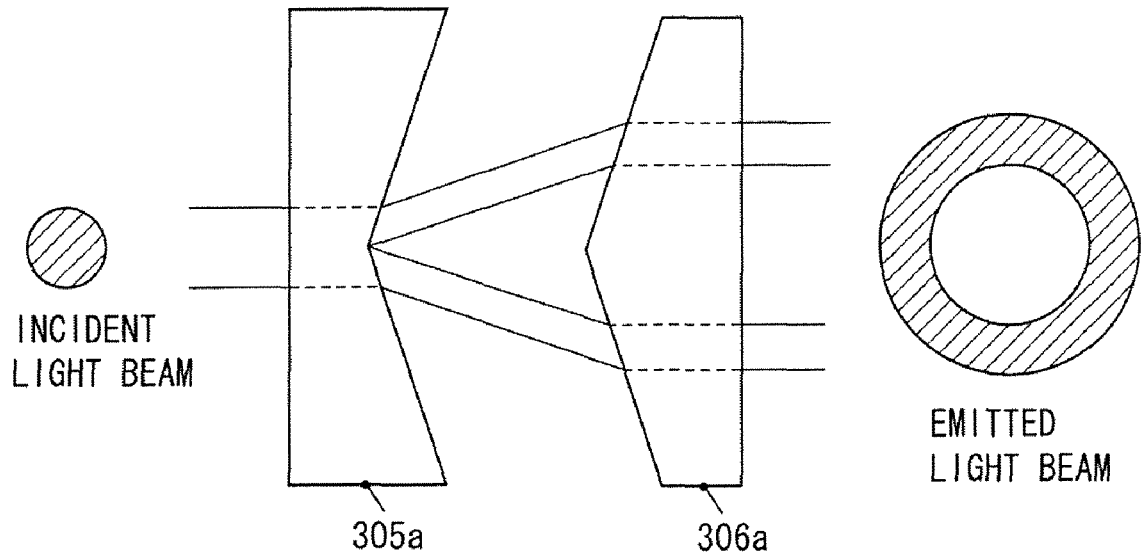

FIGS. 5A and 5B are schematic views showing the range of the annular ratio which is adjustable by the conical concave prism 305a and the conical convex prism 306a.

The inclined surfaces of the conical concave prism 305a and the conical convex prism 306a constituting a first group of prisms are arranged so as to face each other. When the conical concave prism 305a and the conical convex prism 306a are combined, in other words, the space between the both prisms is zero, as shown in FIG. 5A, the first group of prisms (the conical concave prism 305a and the conical convex prism 306a) forms a flat plate. Actually, it is difficult that the space between the both prisms is adjusted to zero since the interference of the prisms should be avoided. However, if the space between the both prisms is a finite small value, the first group of prisms is substantially regarded as a flat plate. In this case, the optical action of the first group of prisms is substantially equal to a flat plate. For example, when the circular light beam (an incident light beam) shown in the left of FIG. 5A enters the first group of prisms, the circular light beam (an emitted light beam) which is similar to that of the incident light beam is emitted as shown in the right of FIG. 5A.

As shown in FIG. 5B, when the space between the conical concave prism 305a and the conical convex prism 306a constituting the first group of prisms is changed to be greater, the emitted light beam having an annular shape can be obtained. When the space between the conical concave prism 305a and the conical convex prism 306a is changed to be greater and the circular light beam (the incident light beam) shown in the left of FIG. 5B enters the first group of prisms, the light beam having the annular shape (the emitted light beam) as shown in the right of FIG. 5B is formed on the emitted surface. Thus, the greater the relative distance between the conical concave prism 305a and the conical convex prism 306a, the higher the annular ratio of the light beam emitted from the first group of prisms.

As shown in FIGS. 5A and 5B, when the inclined surfaces of the conical concave prism 305a and the conical convex prism 306a are arranged so as to face each other, the inclined angle of the prisms are set to equal to or smaller than 25°, more preferably to equal to or smaller than 20°. When an inclined angle of a prism is θ, a glass material refractive index of a prism is n, an emitted angle of a light beam with respect to a normal line of an inclined surface of a prism is θ', according to expression (2) representing Snell's law, the emitted angle θ' can be calculated.

$$\sin \theta' = n \cdot \sin \theta \quad (2)$$

Generally, the glass material refractive index n is about 1.5. Therefore, when the inclined angle θ of a prism is 25°, the emitted angle of the light beam is 39.34°, and when the inclined angle θ is 20°, the emitted angle of the light beam is 30.87°. If the incident angle and the emitted angle of the light beam are great, an amount of the light which is reflected and scattered is great and the efficiency decreases. As a result, a desired light intensity distribution can not be obtained.

In case that the inclined angle θ of the prism is extremely small, when a light beam having a great annular ratio and a shin annular shape is formed, the space between the conical concave prism 305a and the conical convex prism 306a needs to be greater. In this case, however, the apparatus grows in size.

As another method for forming a light beam having a great annular ratio and a shin annular shape, there is also a method of entering a small circular light beam. In this case, however, the energy density of light is higher and the optical system is greatly exhausted.

There is an unstable area where fabricating the prism is difficult in the center of the prism. In FIGS. 5A and 5B, schematically, an ideal conical-shaped prism is illustrated. However, actually, there is the unstable area at an apex part which is round, hollow, translucent, or the like. When a small circular light beam enters, the rate accounting the light which passes through the unstable area is great. Therefore, the efficiency decreases and the desired light intensity distribution can not be obtained.

Figure 6A:
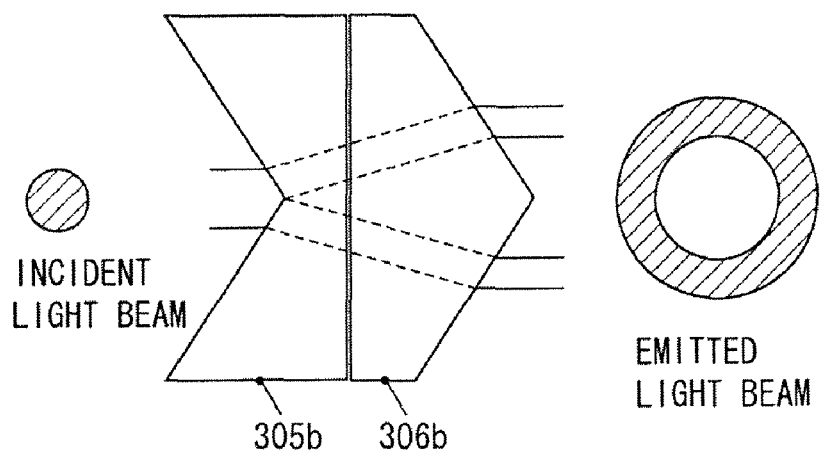
FIGS. 6A and 6B are illustrations of a second group of prisms in Embodiment 1 of the present invention.
Figure 6B:
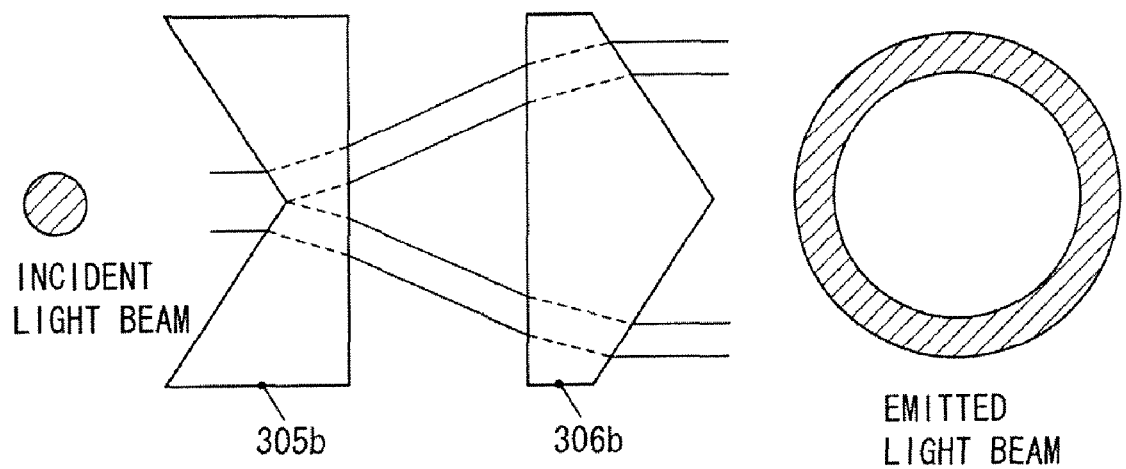

As described above, according to the configuration shown in FIGS. 5A and 5B, the annular ratio can be continuously adjusted from 0 to ⅔ or higher (a first range) without decreasing in efficiency and growing in size of the apparatus FIGS. 6A and 6B show one example of the range of the annular ratio which is adjustable by the conical concave prism 305b and the conical convex prism 306b.

The inclined surfaces of the conical concave prism 305b and the conical convex prism 306b constituting a second group of prisms are arranged so as to face each other in opposite directions. Therefore, when the space between the both prisms is zero as shown in FIG. 6A and a circular light beam (an incident light beam) shown in the left of FIG. 6A enters, an emitted light beam emitted from the conical convex prism 306b has an annular shape as shown in the right of FIG. 6A. When the conical concave prism 305b and the conical convex prism 306b constituting the second group of prisms are combined so that the inclined surfaces of these prisms are arranged to face each other, these prisms have a relation of forming a flat plate. This is similar to the first group of prisms.

As shown in FIG. 6B, when the space between the conical concave prism 305b and the conical convex prism 306b which constitute the first group of prisms is changed to be greater, a further thin annular light beam can be obtained. The space between the both prisms shown in FIG. 6B is the same as that of prisms in FIG. 5B. When the space between the both prisms is changed to be greater as shown in FIG. 6B and the circular light beam (the incident light beam) shown in the left of FIG. 6B enters, the light beam having the shin annular shape whose annular ratio is equal to or higher than ⅘ (the emitted light beam) as shown in the right of FIG. 6B is formed on the emitted surface. Thus, the greater the relative distance between the conical concave prism 305b and the conical convex prism 306b, the higher the annular ratio of the light beam emitted from the second group of prisms.

As shown in FIGS. 6A and 6B, when the conical concave prism 305b and the conical convex prism 306b are arranged so that the inclined surfaces face each other in opposite directions, the inclined angle of the prism can be greater than the case where the inclined surfaces are arranged so as to face each other. This is because the incident angle and the emitted angle of the parallel light beam with respect to the prism correspond to the inclined angle of the prism when the inclined surfaces of the prisms are arranged in opposite directions. Therefore, when the inclined surfaces of the prisms are arranged in opposite directions, even if the inclined angle is equal to or greater than 30°, an amount of reflecting and scattering the light is comparatively small.

In the present embodiment, the upper limit of the annular ratio of the light beam emitted from the first group of prisms is equal to or higher than the lower limit of the light beam emitted from the second group of prisms and is lower than the upper limit of the light beam emitted from the second group of prisms.

Thus, it is preferable that the annular ratio in the case where the space between the conical concave prism 305b and the conical convex prism 306b is zero is set to equal to or lower than the annular ratio in the case where the space between the conical concave prism 305a and the conical convex prism 306a is the highest. This is because the annular ratio is set to be continuously changed and can be continuously adjusted.

According to the configuration shown in FIGS. 6A and 6B, the annular ratio can be continuously adjusted in the range of ⅔ or lower to ⅘ or higher (a second range) without the decrease in efficiency and the growth in size of the apparatus. The second range is different from the first range and includes at least a value (an annular ratio) higher than the value included in the first range. Therefore, the annular ratio can be widely adjusted in the range of zero to ⅘ or higher by combining with the prism shown in FIGS. 5A and 5B.

Thus, according to the present embodiment, the first group of prisms which is used for continuously adjusting the annular ratio in the first range and the second group of prisms which is used for continuously adjusting the annular ratio in the second range are provided. When the first group of prisms is introduced in the optical path, the annular ratio of the light beam emitted from the first group of prisms is continuously adjusted in the first range by the prism moving means 309. When the second group of prisms is introduced in the optical path, the annular ratio of the light beam emitted from the second group of prisms is continuously adjusted in the second range by the prism moving means 309.

In the above explanation, the first group of prisms and the second group of prisms can be selectively introduced in the optical path by the switch of a group of prisms. Furthermore, another optical system which is configured to be switched and introduced by the switch of a group of prisms can also be provided.

The present embodiment can also be configured so that the first group of prisms (one of the groups of prisms) is always positioned in the optical path and only the second group of prisms (the other group of prisms) is capable of being inserted in or removed from the optical path. In this configuration, when light having a desired annular ratio is obtained by the first group of prisms, the second group of prisms is positioned outside the optical path. On the other hand, when light having a desired annular ratio is obtained by the second group of prisms, the first group of prisms is configured to be in a state of a flat plate by combining the first concave prism with the second convex prism. According to such a configuration, even if the first group of prisms is positioned in the optical path, in view of the annular ratio, it is a state where the first group of prisms does not substantially exist. Thus, the present embodiment can also adopt the configuration in which only the second group of prisms moves between inside and outside the optical path.

As described above, according to the present embodiment, the annular ratio can be continuously adjusted in the range between at least ½ and ⅘ with high efficiency while suppressing the growth in size of the apparatus.

Embodiment 2

Figure 9:
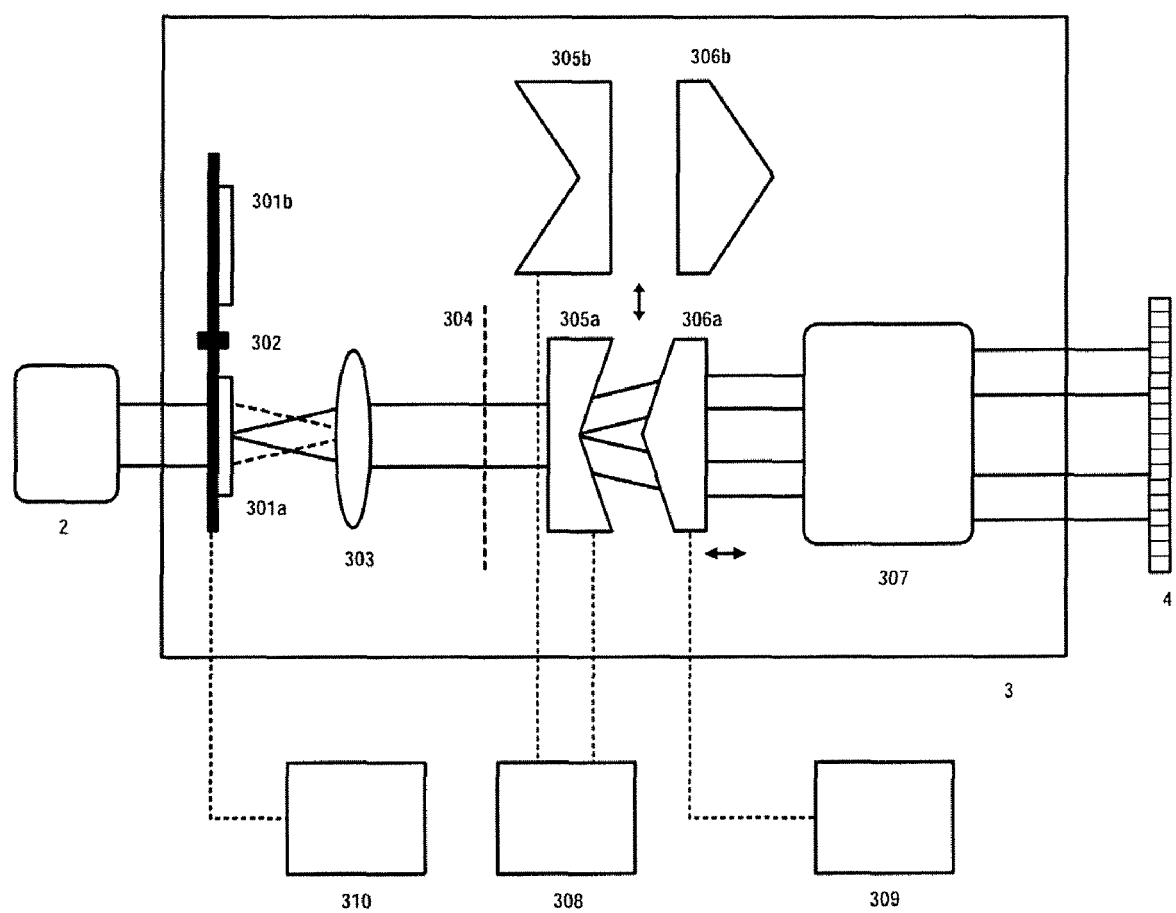
FIG. 9 is a schematic view of a beam shaping optical system in Embodiment 2 of the present invention.

Next, referring to FIG. 9, a beam shaping optical system 3 in Embodiment 2 will be described in detail. According to the configuration in the present embodiment, compared to Embodiment 1, the adjustment range of the annular ratio can be further expanded.

In the present embodiment, similarly to Embodiment 1, the first group of prisms and the second group of prisms are configured to be switched. Therefore, one of these groups of prisms can be selectively introduced in the optical path.

In the present embodiment, a plurality of diffractive optical elements 301a and 301b are attached to a turret 302, and one of these diffractive optical elements can be selectively introduced in the optical path.

A light beam supplied from a light source 1 enters any one of the plurality of diffractive optical elements 301a and 301b. The plurality of diffractive elements 301a and 301b are attached to the turret 302, and one of the diffractive optical elements 301a and 301b is configured so as to be selectively introduced in the optical path. Selecting any one of the diffractive optical elements 301a and 301b is performed by a diffractive optical element selector 310 rotating the turret 302. In FIG. 9, two diffractive optical elements 301a and 301b are shown. However, the number of the diffractive optical elements is not limited to this. Three or more diffractive optical elements can be provided.

In the case where a computer-generated hologram is used as a diffractive optical element, a light intensity distribution having an arbitrary shape which corresponds to each of the diffractive optical elements can be formed on a Fourier transform surface 304 of the computer-generated hologram via a condenser optical system 303. The pattern formed on the Fourier transform surface 304 is, for example, a circular shape, an annular shape, or a multipole shape.

Next, referring to FIGS. 4A and 4B, one example of a specific switching mechanism of the diffractive optical element will be described.

Figure 4A:
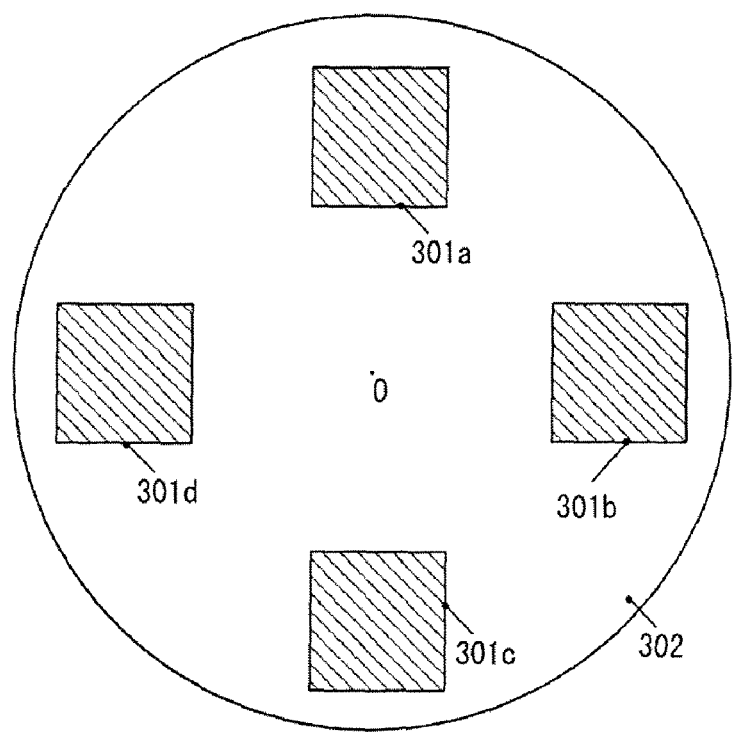
FIGS. 4A and 4B are schematic views of a diffractive optical element in the embodiment of the present invention.

As shown in FIG. 4A, the turret 302 is provided with a plurality of diffractive optical elements 301a, 301b, 301c, and 301d. The turret 302 is configured to be rotatable on the basis of a point O as a center of the rotation so that one of four diffractive optical elements 301a, 301b, 301c, and 301d provided on the turret 302 is positioned in the optical path. The rotation of the turret 302 is driven and controlled by the diffractive optical element selector 310.

Figure 4B:
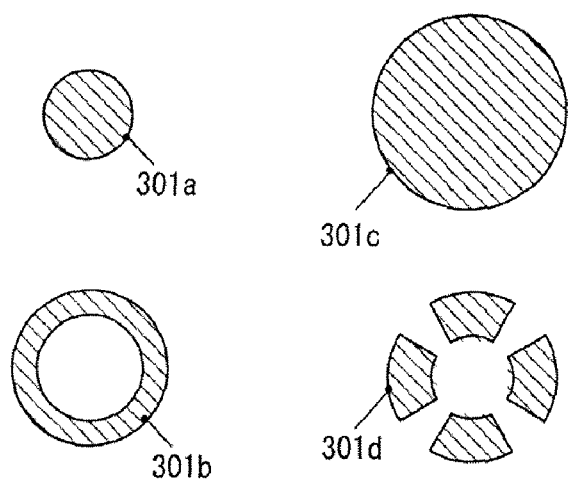

As shown in FIG. 4B, the diffractive optical element 301a and 301c form a circular pattern on the Fourier transform surface 304. The diffractive optical element 301b forms an annular shape pattern on the Fourier transform surface 304. The diffractive optical element 301d forms a multipole pattern on the Fourier transform surface 304.

Figure 7A:
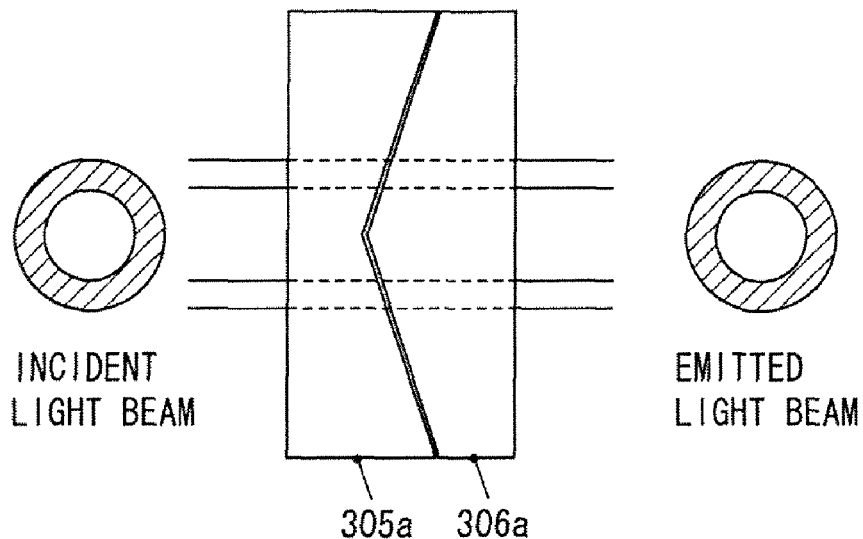
FIGS. 7A and 7B are illustrations for the change of an annular ratio in Embodiment 2 of the present invention.

Next, referring to FIGS. 7A and 7B, the adjustment range of the annular ratio in the case where the light beam having an annular shape enters the conical concave prism 305a and the conical convex prism 306a will be described.

The inclined surfaces of the conical concave prism 305a and the conical convex prism 306a are arranged so as to face each other. Therefore, as shown in FIG. 7A, when the space between the both prisms is zero, the optical action is equal to that of the flat plate. Actually, it is difficult that the space between the both prisms is adjusted to zero since the interference of the prisms should be avoided. However, if the space between the both prisms is a finite small value, the first group of prisms is substantially regarded as a flat plate. In this case, as shown in the right and the left of FIG. 7A, the change of the annular ratio is small between the incident light beam and the emitted light beam.

Figure 7B:
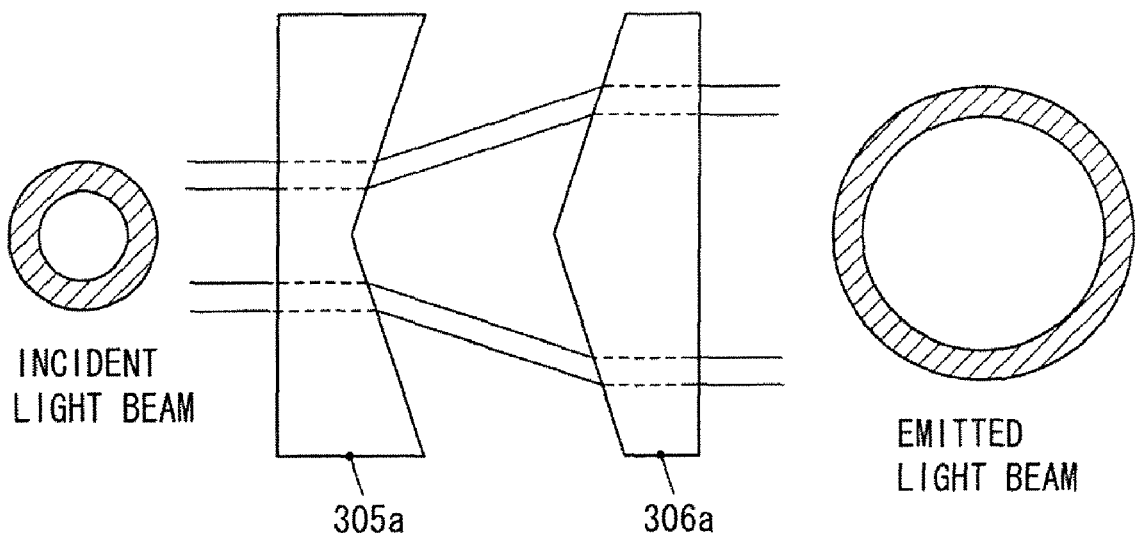
Figure 8:
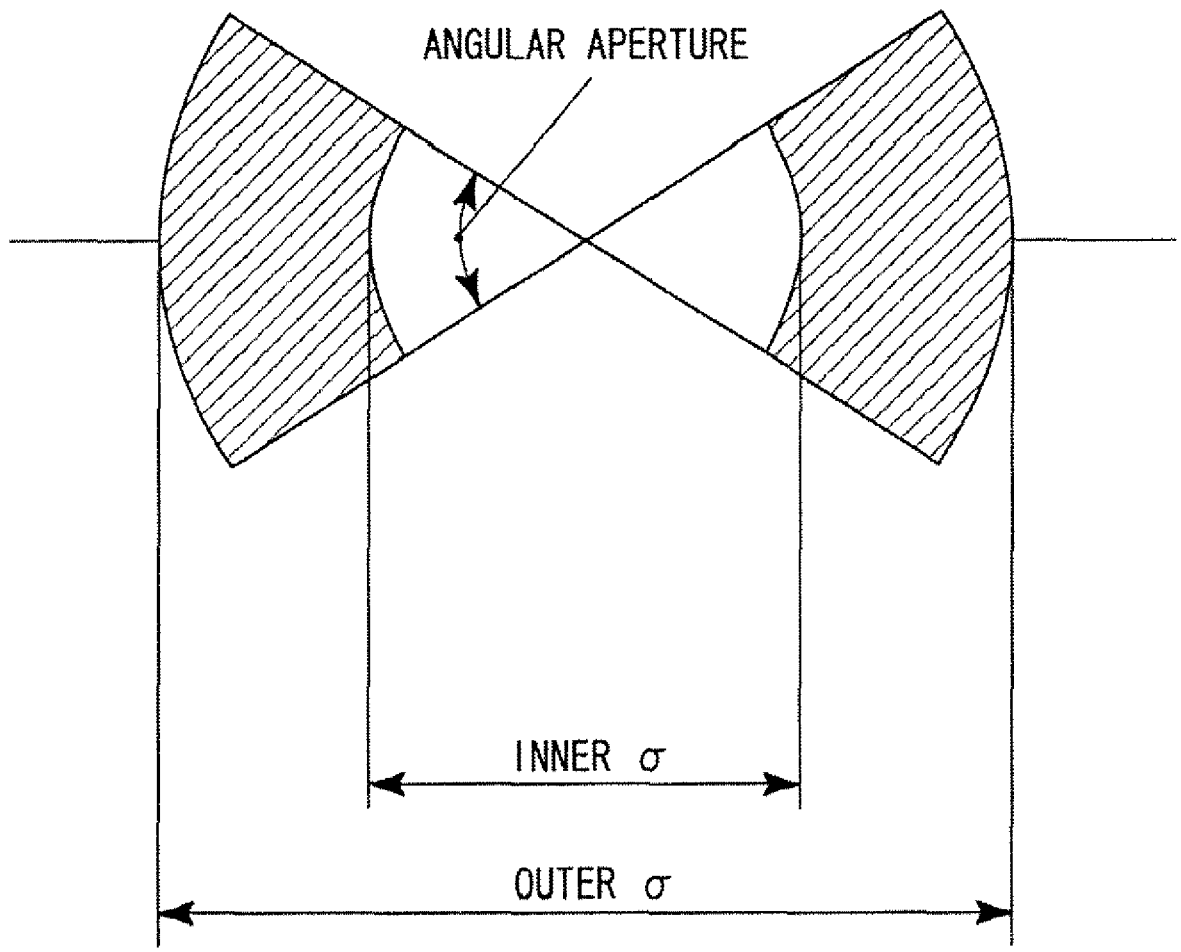
FIG. 8 is an illustration for parameters of an effective light source.

On the other hand, when the space between the conical concave prism 305a and the conical convex prism 306a is greater as shown in FIG. 7B, the annular ratio of the emitted light beam is changed to be higher as shown in the right of FIG. 7B and an emitted light beam having a thinner annular shape can be obtained.

When a circular light beam enters the conical concave prism 305a and the conical convex prism 306a using the diffractive optical element 301a, as shown in FIGS. 5A and 5B, the annular ratio can be changed from zero to ⅔ or higher. If the minimum value of the annular ratio of the pattern having an annular shape which the diffractive optical element 301b forms on the Fourier transform surface is set to ⅔ or lower, the annular ratio can be changed from ⅔ or lower to ⅘ or higher by changing the space between the conical concave prism 305a and the conical convex prism 306a. Therefore, the annular ratio can be adjusted from zero to ⅘ or higher by switching the diffractive optical elements 301a and 301b using the diffractive optical element selector 310 and by adjusting the space of the prisms using the prism moving means 309.

Figure 10A:
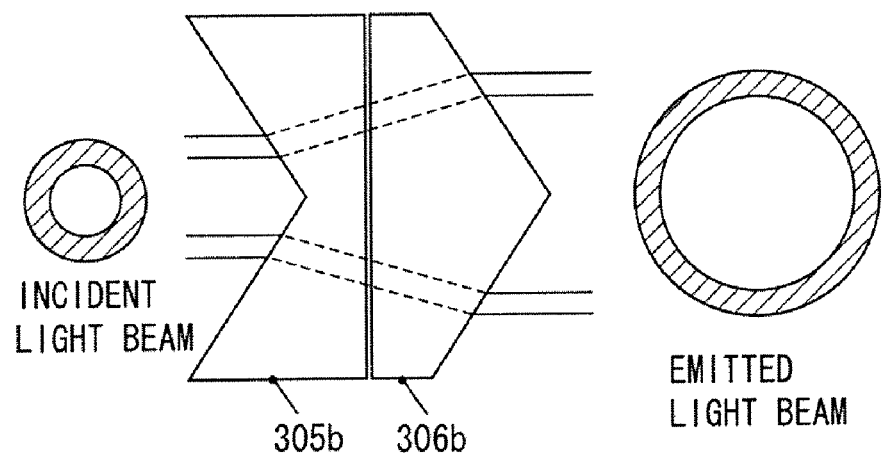
FIGS. 10A and 10B are illustrations for the change of an annular ratio in Embodiment 2 of the present invention.

Next, referring to FIGS. 10A and 10B, the adjustment range of the annular ratio in the case where the light beam having an annular shape enters the conical concave prism 305b and the conical convex prism 306b will be described.

The inclined surfaces of the conical concave prism 305b and the conical convex prism 306b face each other in opposite directions. Therefore, even if the space between the both prisms is zero as shown in FIG. 10A, the emitted light beam emitted from the conical convex prism 306b shown in the right of FIG. 10A has an annular shape which is thinner than the incident light beam shown in the left of FIG. 10A.

Figure 10B:
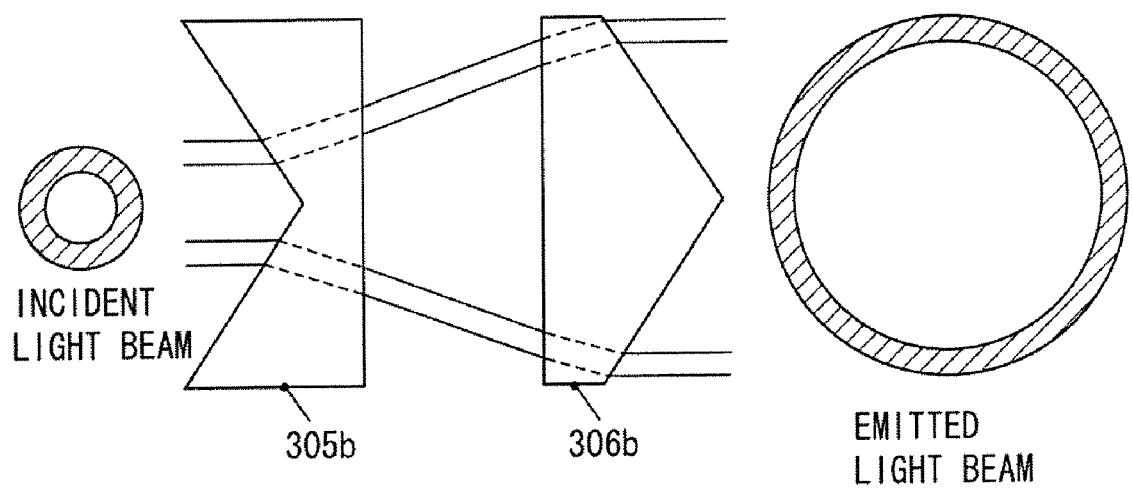

As shown in FIG. 10B, when the space between the conical concave prism 305b and the conical convex prism 306b is changed to be greater, a light beam having a further thin annular shape can be obtained. As shown in the left of FIG. 10B, when the incident light beam having an annular shape enters the group of prisms, the emitted light beam having a thin annular shape whose annular ratio is equal to or higher than ⅚ is formed on the emitted surface as shown in the right of FIG. 10B.

Thus, according to the present embodiment, the annular ratio can be continuously adjusted in a further wider range with high efficiency while suppressing the growth in size of the apparatus.

By the way, when the diffractive optical element 301d is introduced into the optical path, a pattern having a multipole shape is formed on the Fourier transform surface 304. In this case, when the space between a pair of the conical prisms is changed, the angular aperture of each pole cannot always be controlled even though the ratio of the outer σ and the inner σ can be adjusted. This is because a conical surface has a refractive action in a circumferential direction and a pole shape formed on the Fourier transform surface 304 is deformed in the circumferential direction on the conical surface.

In this regard, according to the consideration by the inventor, it has been revealed, in order to make the change of the angular aperture smaller, that the numerical aperture NA of the light beam entering the conical prism is preferably set to equal to or smaller than 0.1 and the diameter φ of the light beam entering the conical prism is preferably set to equal to or greater than 20 nm. Furthermore, it is preferable that an apex angle θ of the conical prism is set to equal to or smaller than 20°. Therefore, it is preferable that at least one prism among the prisms provided in the beam shaping optical system 3 of the above embodiment meets the above conditions.

In the above embodiment, a conical prism is used as a prism. However, if needed, for example in the case where a complex off-axis illumination such as a multipole illumination is formed, a pyramidal prism, a deformed conical prism which has a plane in the central part, or the like, can also be used.

In the above embodiment, a micro lens array or a diffractive optical element is used as an optical integrator. However, for example, another integrator such as a rod-type integrator can also be used.

A device (a semiconductor device, a liquid crystal display device, or the like) is manufactured by passing through a process of exposing a substrate (a wafer, a glass plate, or the like) which is coated by a photosensitizing agent using a exposure apparatus in any one of the above embodiments, a process of developing the substrate, and other well-known processes.

According to the above device manufacturing method, a high-grade device can be manufactured. Thus, a device manufacturing method using the above exposure apparatus and a device as a manufacture also constitute one aspect of the present invention.

According to the above embodiment of the present invention, an illumination optical apparatus which is configured to widely and continuously adjust the annular ratio can be provided. In particular, an illumination optical apparatus which is configured to adjust the annular ratio at least in the range of ½ to ⅘ can also be provided. According to the above embodiment, the annular ratio can be efficiently adjusted while suppressing the growth in size of the apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

For example, as a prism, it is not limited to the concave prism or the convex prism described in the above embodiment. An optical member such as a diffractive optical element which has the same action as that of the prism can also be used.

The arrangement of the conical surface (the inclined surface) of the prisms is not limited to that shown in FIGS. 5 and 6. Either conical surface can be arranged at a light source side or at a surface to be irradiated side with respect to the prism. For example, with regard to the positional relation of the first concave prism and the first convex prism which constitute the first group of prisms, the first concave prism is positioned at the side of the surface to be irradiated, and the first convex prism is positioned at the side of the light source. Both conical surfaces of the first concave prism and the first convex prism are positioned at the side of the light source. With regard to the positional relation of the second concave prism and the second convex prism which constitute the second group of prisms, the second concave prism is positioned at the side of the light source and the second convex prism is positioned at the side of the surface to be irradiated. Both conical surfaces of the second concave prism and the second convex prism are positioned at the side of the surface to be irradiated.

This application claims the benefit of Japanese Patent Application No. 2007-302789, filed on Nov. 22, 2007, which is hereby incorporated by reference herein in its entirety.

What is claimed is:

1. An illumination optical apparatus configured to irradiate a light beam from a light source onto a surface to be irradiated, the illumination optical apparatus comprising:
   a first group of prisms which has a plurality of prisms;
   a second group of prisms which has a plurality of prisms; and
   a switch of a group of prisms which is capable of switching the first and the second groups of prisms so as to position one of the first and the second groups of prisms in an optical path,
   wherein an annular ratio of the light beam emitted from one of the first and the second groups of prisms is changed by moving at least one of a plurality of prisms included in one of the first and the second groups of prisms positioned in the optical path in an optical axis direction, wherein an upper limit of the annular ratio of the light beam emitted from the first group of prisms is equal to or higher than a lower limit of the annular ratio of the light beam emitted from the second group of prisms and is lower than the upper limit of the annular ratio of the light beam emitted from the second group of prisms, wherein the first group of prisms includes a first concave prism and a first convex prism whose inclined surfaces are arranged so as to face each other, wherein the second group of prisms includes a second concave prism and a second convex prism whose inclined surfaces are arranged so as to face each other in opposite directions, and wherein at least one of the concave prism and the convex prism included in one of the first and the second groups of prisms positioned in the optical path is movable in the optical axis direction.

2. An illumination optical apparatus according to claim 1, wherein the first group of prisms is configured to be substantially a flat plate by combining the first concave prism with the first convex prism.

3. An illumination optical apparatus configured to irradiate a light beam from a light source onto a surface to be irradiated, the illumination optical apparatus comprising:

a first group of prisms which has a plurality of prisms;

a second group of prisms which has a plurality of prisms;

a switch of a group of prisms which is capable of switching the first and the second groups of prisms so as to position one of the first and the second groups of prisms in an optical path;

a plurality of diffractive optical elements configured to diffract the light beam from the light source to enter the group of prisms positioned in the optical path;

a diffractive optical element selector configured to select one of the plurality of the diffractive optical elements to be positioned in the optical path; and a condenser optical system configured to condense the light beam emitted from the diffractive optical element positioned in the optical path, wherein an annular ratio of the light beam emitted from one of the first and the second groups of prisms is changed by moving at least one of a plurality of prisms included in one of the first and the second groups of prisms positioned in the optical path in an optical axis direction, wherein an upper limit of the annular ratio of the light beam emitted from the first group of prisms is equal to or higher than a lower limit of the annular ratio of the light beam emitted from the second group of prisms and is lower than the upper limit of the annular ratio of the light beam emitted from the second group of prisms, and wherein the annular ratio is adjusted by the diffractive optical element selector switching the diffractive optical element which is positioned in the optical path.

4. An illumination optical apparatus according to claim 1, wherein an inclined angle of the second concave prism is greater than that of the first concave prism.

5. An illumination optical apparatus configured to irradiate a light beam from a light source onto a surface to be irradiated, the illumination optical apparatus comprising:

a first group of prisms which has a plurality of prisms; and a second group of prisms which has a plurality of prisms, wherein one of the first and the second groups of prisms includes a first concave prism and a first convex prism whose inclined surfaces are arranged so as to face each other, and has a shape of substantially a flat plate by combining the first concave prism with the first convex prism, wherein the other one of the first and the second groups of prisms is capable of being inserted into and removed from the optical path of the light beam, wherein an annular ratio of the light beam emitted from one of the first and the second groups of prisms is changed by moving at least one of a plurality of prisms included in one of the first and the second groups of prisms in an optical axis direction, and wherein an upper limit of the annular ratio of the light beam emitted from the first group of prisms is equal to or higher than a lower limit of the annular ratio of the light beam emitted from the second group of prisms and is lower than the upper limit of the annular ratio of the light beam emitted from the second group of prisms.

6. An exposure apparatus comprising:

an illumination optical apparatus according to claim 5, and a projection optical system configured to project an image of a pattern of an original plate positioned on the surface to be irradiated onto a substrate.

7. A method of manufacturing a device comprising the steps of:

exposing a substrate using an exposure apparatus according to claim 6; and developing the exposed substrate.

8. An exposure apparatus comprising:

an illumination optical apparatus according to claim 1, and a projection optical system configured to project an image of a pattern of an original plate positioned on the surface to be irradiated onto a substrate.

9. A method of manufacturing a device comprising the steps of:

exposing a substrate using an exposure apparatus according to claim 8; and developing the exposed substrate.

10. An exposure apparatus comprising:

an illumination optical apparatus according to claim 3, and a projection optical system configured to project an image of a pattern of an original plate positioned on the surface to be irradiated onto a substrate.

11. A method of manufacturing a device comprising the steps of:

exposing a substrate using an exposure apparatus according to claim 10; and developing the exposed substrate.

* * * * *